(12) United States Patent
Gurin

(10) Patent No.: US 9,099,591 B1
(45) Date of Patent: Aug. 4, 2015

(54) HYBRID SOLAR RECEIVER

(76) Inventor: Michael H. Gurin, Glenview, IL (US)

( * ) Notice: Subject to any disclaimer, the term of this patent is extended or adjusted under 35 U.S.C. 154(b) by 1487 days.

(21) Appl. No.: 12/615,101

(22) Filed: Nov. 9, 2009

Related U.S. Application Data

(60) Provisional application No. 61/112,512, filed on Nov. 7, 2008.

(51) Int. Cl.
*H01L 31/052* (2014.01)

(52) U.S. Cl.
CPC .............. H01L 31/052 (2013.01); *Y02E 10/50* (2013.01)

(58) Field of Classification Search
CPC ....................................... H01L 31/052
USPC ................................. 136/246, 244
See application file for complete search history.

(56) References Cited

U.S. PATENT DOCUMENTS

| 4,045,246 A | * | 8/1977 | Mlavsky et al. | 136/246 |
| 4,084,576 A | * | 4/1978 | Pei | 126/657 |
| 4,106,952 A | * | 8/1978 | Kravitz | 136/206 |
| 4,205,657 A | * | 6/1980 | Kelly | 126/603 |
| 4,235,221 A | * | 11/1980 | Murphy | 126/567 |
| 4,397,303 A | * | 8/1983 | Stultz | 126/651 |
| 6,201,179 B1 | * | 3/2001 | Dalacu | 136/244 |
| 2006/0021648 A1 | * | 2/2006 | Parise | 136/259 |

FOREIGN PATENT DOCUMENTS

JP          59-152671  A  *  8/1984  .............. H01L 31/04

OTHER PUBLICATIONS

Akbarzadeh et al., "Heat pipe-based cooling systems for photovoltaic cells under concentrated solar radiation", Applied Thermal Engineering, vol. 16, Issue 1, Jan. 1996, pp. 81-87.*

* cited by examiner

*Primary Examiner* — Golam Mowla

(57) ABSTRACT

The present invention generally relates to hybrid solar receivers, mixed field arrays and hybrid power systems that utilize at least one solar receiver. In one embodiment, the present invention relates to a hybrid solar receiver comprised of at least one photovoltaic cell, at least two heat exchangers wherein at least one of the heat exchangers provides active cooling of the photovoltaic cell, and at least one of the heat exchangers provides thermal energy to drive at least one thermodynamic cycle.

13 Claims, 8 Drawing Sheets

HYBRID SOLAR RECEIVER

RELATED APPLICATION DATA

This application claims priority to U.S. Provisional Patent Application No. 61/112,512 filed Nov. 7, 2008, entitled "Hybrid Solar Receiver," which is hereby incorporated in its entirety by reference.

FIELD OF THE INVENTION

The present invention generally relates to hybrid solar receivers, mixed field arrays and hybrid power systems that utilize at least one solar receiver. In one embodiment, the present invention relates to a hybrid solar receiver comprised of at least one photovoltaic cell, at least two heat exchangers wherein at least one of the heat exchangers provides active cooling of the photovoltaic cell, and at least one of the heat exchangers provides thermal energy to drive at least one thermodynamic cycle.

BACKGROUND OF THE INVENTION

Due to a variety of factors including, but not limited to, global warming issues, fossil fuel availability and environmental impacts, crude oil price and availability issues, alternative energy sources are becoming more popular today. One such source of alternative and/or renewable energy is solar energy. One such way to collect solar energy is to use a solar receiver to focus and convert solar energy into a desired form (e.g., thermal energy or electrical energy). Given this, solar receivers that function in efficient manners are desirable.

SUMMARY OF THE INVENTION

The present invention generally relates to hybrid solar receivers, mixed field arrays and hybrid power systems that utilize at least one solar receiver. In one embodiment, the present invention relates to a hybrid solar receiver comprised of at least one photovoltaic cell, at least two heat exchangers wherein at least one of the heat exchangers provides active cooling of the photovoltaic cell, and at least one of the heat exchangers provides thermal energy to drive at least one thermodynamic cycle.

In one embodiment, the present invention relates to a hybrid solar receiver comprising: at least one photovoltaic cell; at least two heat exchangers, wherein at least one of the heat exchangers provides active cooling of the photovoltaic cell; and at least one of the heat exchangers provides thermal energy to drive at least one thermodynamic cycle.

In another embodiment, the present invention relates to a hybrid solar receiver comprising: at least one photovoltaic cell; a thermal diode; and at least one heat exchanger, wherein the at least one of heat exchanger provides active cooling of the photovoltaic cell and thermal energy to drive a thermodynamic cycle and wherein the thermal diode is operable to isolate the at least one photovoltaic cell from the at least about 10° C. higher temperatures of the thermodynamic cycle.

In still another embodiment, the present invention relates to a hybrid solar receiver comprising: at least one photovoltaic cell; and at least two heat exchangers, wherein the at least two heat exchanges comprise at least a first heat exchanger providing active cooling to the at least one photovoltaic cell, and a second heat exchanger capturing solar thermal energy to thermally drive an absorption heat pump, wherein the absorption heat pump provides active cooling of the photovoltaic cell operable to increase energy conversion efficiency of the at least one photovoltaic cell.

In still another embodiment, the present invention relates to a hybrid solar receiver comprising: a heat exchanger; a working fluid providing heat transfer from the solar receiver incidence solar flux; and at least one solar concentrator, wherein the hybrid solar receiver is operable in at least two operating modes including radiant collecting mode and radiant reflecting mode.

In still another embodiment, the present invention relates to a hybrid solar receiver comprising: at least one photovoltaic cell; at least one Fresnel lens operable as a solar concentrator; and at least one heat exchanger designed to capture thermal energy from the solar receiver.

In still another embodiment, the present invention relates to a hybrid solar receiver comprising: at least one photovoltaic cell; at least one heat exchanger; and at least one working fluid, wherein the at least one heat exchanger captures incidence solar flux not captured by the at least one photovoltaic cell.

In still another embodiment, the present invention relates to a hybrid solar receiver comprising: at least one photovoltaic cell; at least one heat exchanger; and at least one heat pump, wherein the at least one heat exchanger provides active cooling to the at least one photovoltaic cell and the at least one heat pump lifts a working fluid temperature from a heat pump incoming temperature to a heat pump discharge temperature, wherein the heat pump incoming temperature is at least about 5° C. less than the heat pump discharge temperature, and wherein the heat pump inlet temperature is at least about 2° C. lower than the photovoltaic cell maximum junction temperature.

In still another embodiment, the present invention relates to hybrid solar receivers as shown and described herein.

DETAILED DESCRIPTION OF THE INVENTION

Figure 1:
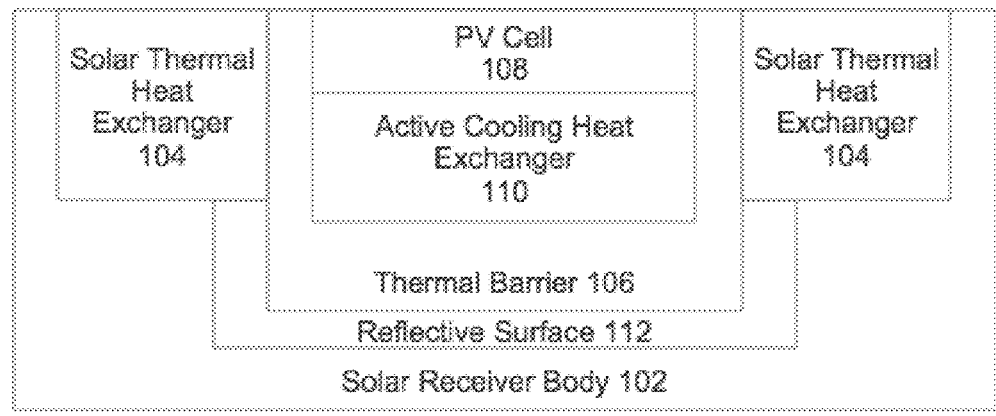
FIG. 1 is a cross-sectional illustration of one embodiment of a hybrid solar receiver in accordance with the present invention.

The term "back surface", as used herein, includes any surface of a photovoltaic cell that is not used to convert incidence solar flux into electrical energy. The term "microchannel", as used herein, includes channel dimensions of less than 2 millimeter. The term "high surface area foam", as used herein, includes foams having an open cell porosity greater than about 50%. The term "in thermal continuity", as used herein, includes the direct connection between the heat source and the heat sink whether or not a thermal interface material is used. The term "heat spreader", as used herein, includes a heat sink having the ability to extend the surface area of heat transfer.

The present invention generally relates to hybrid solar receivers, mixed field arrays and hybrid power systems that utilize at least one solar receiver. In one embodiment, the present invention relates to a hybrid solar receiver comprised of at least one photovoltaic cell, at least two heat exchangers wherein at least one of the heat exchangers provides active cooling of the photovoltaic cell, and at least one of the heat exchangers provides thermal energy to drive at least one thermodynamic cycle.

In one embodiment, the present invention relates to a hybrid solar receiver comprising at least one photovoltaic cell, at least two heat exchangers wherein at least one of the heat exchangers provides active cooling of the photovoltaic cell, and at least one of the heat exchangers provides thermal energy to drive at least one thermodynamic cycle. In one instance, a hybrid solar receiver according to the above embodiment comprises at least two thermally isolated zones, wherein the first thermally isolated zone is for the at least one photovoltaic cell, and the second thermally isolated zone is for the at least one thermodynamic cycle. In one case, the temperature differential between the first thermally isolated zone and the second thermally isolated zone is at least about 50° C., at least about 75° C., at least about 100° C., or even at least about 150° C. In another embodiment, the temperature differential between the first thermally isolated zone and the second thermally isolated zone is in the range of about 100° C. to about 500° C. Here, as well as elsewhere in the specification and claims, individual numerical values and/or individual range limits can be combined to form non-disclosed ranges.

In one embodiment, the above hybrid solar receiver is paired with a solar concentrator that has an incidence solar flux that yields an irradiance on the hybrid solar receiver, wherein the direct irradiance on the hybrid solar receiver is on both the at least one photovoltaic cell and the second thermally isolated zone. In one instance, in this embodiment the at least one photovoltaic cell and the second thermally isolated zone are further comprised of a thermal barrier between the at least one photovoltaic cell and the second thermally isolated zone. In one instance, in this embodiment the second thermally isolated zone further comprises at least one reflective surface wherein the at least one reflective surface has a first surface that reflects the irradiance away from the back surface of the at least one photovoltaic cell. In another embodiment, the hybrid solar receiver of this embodiment is non-isothermal.

In one instance, in this embodiment the hybrid solar receiver of this embodiment further comprises at least one reflective surface wherein the at least one reflective surface reflects at least about 80% of the reflected light away from the back surface of the at least one photovoltaic cell. In one embodiment, the at least one reflective surface reflecting light away from the back surface of the at least one photovoltaic cell has an emissivity greater than about 50%. In another embodiment, the at least one reflective surface reflecting light away from the back surface of the at least one photovoltaic cell has an emissivity greater than about 75%. In still another embodiment, the at least one reflective surface reflecting light away from the back surface of the at least one photovoltaic cell has an emissivity greater than about 85%. In still another embodiment, the at least one reflective surface reflecting light away from the back surface of the at least one photovoltaic cell has an emissivity up to about 95%. Here, as well as elsewhere in the specification and claims, individual numerical values and/or individual range limits can be combined to form non-disclosed ranges.

In one embodiment, the hybrid solar receiver of this embodiment has a second thermally isolated zone that has a non-linear cavity. In one embodiment, the non-linear cavity is a spiral shaped cavity.

In another embodiment, the hybrid solar receiver of this embodiment further comprises a thermal diode between the at least one of the heat exchangers designed to provide active cooling to the photovoltaic cell, and wherein at least one of the heat exchangers provides thermal energy to drive at least one thermodynamic cycle.

In another embodiment, a hybrid solar receiver in accordance with the present invention comprises at least one photovoltaic cell; a thermal diode; and at least one heat exchanger, wherein the at least one of heat exchanger provides active cooling of the photovoltaic cell and thermal energy to drive a thermodynamic cycle and wherein the thermal diode is operable to isolate the at least one photovoltaic cell from the at least about 10° C. higher temperatures of the thermodynamic cycle.

In still another embodiment, a hybrid solar receiver in accordance with the present invention comprises a hybrid solar receiver comprises at least one photovoltaic cell; and at least two heat exchangers, wherein the at least two heat exchanges comprise at least a first heat exchanger providing active cooling to the at least one photovoltaic cell, and a second heat exchanger capturing solar thermal energy to thermally drive an absorption heat pump, wherein the absorption heat pump provides active cooling of the photovoltaic cell operable to increase energy conversion efficiency of the at least one photovoltaic cell. In one embodiment, the absorption heat pump provides active cooling of the photovoltaic cell at a temperature at least about 5° C. less than ambient temperature.

In one embodiment, the hybrid solar receiver of this embodiment further comprises additional solar receivers operable to capture the solar thermal energy and transfer the solar thermal energy to the absorption heat pump. In one embodiment, the solar thermal energy is captured from at least one source including reflected light from the photovoltaic cell, or incidence solar flux directly on the second heat exchanger.

In still another embodiment, a hybrid solar receiver in accordance with the present invention comprises a heat exchanger; a working fluid providing heat transfer from the solar receiver incidence solar flux; and at least one solar concentrator, wherein the hybrid solar receiver is operable in at least two operating modes including radiant collecting mode and radiant reflecting mode. In this embodiment, the radiant collecting mode is operational at times of direct incidence solar flux, and the radiant reflecting mode is operational at times when no direct incidence solar flux is available (e.g., night time or overcast days) so as to provide radiant cooling to the working fluid. In one instance, the radiant cooling provides cooling to the working fluid to a temperature below ambient temperature. In another embodiment, the hybrid solar receiver of this embodiment further comprises a working fluid storage tank operable to store the working fluid cooled by the radiant cooling. In another embodiment, the hybrid solar receiver of this embodiment further comprises a thermodynamic cycle having a high side temperature and pressure and a low side temperature and pressure wherein the thermodynamic cycle utilizes the stored working fluid cooled by the radiant cooling to increase the thermodynamic cycle's energy efficiency through an increased temperature differential between the high side temperature and the low side temperature.

In still another embodiment, a hybrid solar receiver in accordance with the present invention comprises at least one photovoltaic cell; at least one Fresnel lens operable as a solar concentrator; and at least one heat exchanger designed to capture thermal energy from the solar receiver. In this embodiment, in one instance the Fresnel lens provides chromatic dispersion operable to reduce the infrared incidence solar flux on the at least one photovoltaic cell. In one instance, the reduced infrared incidence solar flux on the at least one photovoltaic cell is dispersed on the at least one heat exchanger.

In still another embodiment, a hybrid solar receiver in accordance with the present invention comprises at least one photovoltaic cell; at least one heat exchanger; and at least one working fluid, wherein the at least one heat exchanger captures incidence solar flux not captured by the at least one photovoltaic cell. In one instance, the at least one working fluid provides active cooling of the at least one photovoltaic cell. In another instance, the at least one working fluid changes phase from a liquid to a vapor when the at least one working fluid is in thermal communication with the at least one photovoltaic cell. In one embodiment, the hybrid solar receiver of this embodiment further comprises a second working fluid and a second heat exchanger, wherein the second working fluid flows through the second heat exchanger, and wherein the first heat exchanger and the second heat exchanger are not in thermal communication with each other.

In one embodiment, the working fluid is superheated by the incidence solar flux not captured by the at least one photovoltaic cell. In another embodiment, the hybrid solar receiver of this embodiment further comprises a solar concentrator wherein the solar concentrator has a higher energy efficiency for the same solar concentrator tolerance or tracking error due to at least one misalignment selected from the group consisting of tilt, tip, or translation misalignments.

In one embodiment, the ratio between photovoltaic cell incidence area and at least one heat exchanger incidence area is at least about 1:0.2, is at least about 1:0.5, is at least about 1:1, is at least about 1:2, is at least about 1:3, is at least about 1:4, or is even at least about 1:5. Here, as well as elsewhere in the specification and claims, individual numerical values and/or individual range limits can be combined to form non-disclosed ranges.

In one embodiment, the ratio between photovoltaic cell incidence area and at least one heat exchanger incidence area is the maximum ratio operable to achieve an incidence solar flux variation of less than about 20%, less than about 15%, less than about 10%, less than about 5%, or even less than about 2% on the at least one photovoltaic cell. Here, as well as elsewhere in the specification and claims, individual numerical values and/or individual range limits can be combined to form non-disclosed ranges.

In another embodiment, the heat exchanger is a microchannel heat exchanger or high surface area foam in thermal continuity with the heat transfer fluid pipe operable as a heat spreader to achieve an increase in heat spreader surface area of greater than about 20%, greater than about 50%, greater than about 100%, or even greater than about 500% on the at least first heat exchanger or second heat exchanger. Here, as well as elsewhere in the specification and claims, individual numerical values and/or individual range limits can be combined to form non-disclosed ranges.

In one embodiment, the heat exchanger surface is coated with a solar selective coating that has absorption greater than about 80%, emissivity less than about 20%, and increases the heat exchanger surface oxidation greater than about 20%, greater than about 50%, or even greater than about 200%. Here, as well as elsewhere in the specification and claims, individual numerical values and/or individual range limits can be combined to form non-disclosed ranges.

In still another embodiment, a hybrid solar receiver in accordance with the present invention comprises at least one photovoltaic cell; at least one heat exchanger having a heat exchanger substrate; and at least one heat exchanger surface coating, wherein the at least one heat exchanger surface coating captures incidence solar flux and reduces oxidation of the at least one heat exchanger substrate. In one embodiment, the at least one heat exchanger surface coating has a solar absorption of greater than about 80%, an emissivity of less than about 20% and a reduction of the oxidation of the at least one heat exchanger substrate by greater than about 50%.

In still another embodiment, a hybrid solar receiver in accordance with the present invention comprises at least one photovoltaic cell; at least one heat exchanger; at least one working fluid; and at least one working fluid pipe, wherein the at least one working fluid pipe has an integral heat spreader in thermal continuity with the at least one heat exchanger and wherein the at least one working fluid pipe has a pipe connector to the hybrid solar receiver. In one embodiment, the at least one working fluid pipes integral heat spreader increases the surface area of the heat spreader by at least about 50% of the heat spreader area within the hybrid solar receiver at least one heat exchanger.

Exemplary embodiments of the present invention will now be discussed with reference to the attached Figures. Such embodiments are merely exemplary in nature and not to be construed as limiting the scope of the present invention in any manner. With regard to FIGS. 1 through 10, like reference numerals refer to like parts.

Turning to FIG. 1, FIG. 1 is a cross-sectional illustration of one embodiment of a hybrid solar receiver 100 in accordance with the present invention. In the embodiment of FIG. 1 hybrid solar receiver 100 is comprised of a solar receiver body 102, in which is formed a solar thermal heat exchanger 104, a thermal barrier 106, a photovoltaic cell 108, an active cooling heat exchanger 110, and a reflective surface 112. Hybrid solar receiver 100 can be designed to be any desired shape. As such, the present invention is not limited to any one geometric shape. The solar receiver body 102 is formed from any suitable material including, but not limited to, ceramic material, metal, plastic, or a combination of two or more thereof. Solar thermal heat exchanger 104 is formed from any suitable heat exchanger material and can be of any suitable heat exchanger design. Suitable designs and materials from which to construct heat exchangers are known in the art. Exemplary heat exchangers include, but are not limited to, shell and tube heat exchangers, plate heat exchangers, regenerative heat exchangers, plate fin heat exchangers, and/or fluid heat exchangers. Solar thermal heat exchanger 104 can be designed to be any suitable three-dimensional geometric shape and as such the present invention is not limited to any one shape and/or orientation. As such, a detailed discussion herein is omitted for the sake of brevity.

Thermal barrier 106 is formed from any suitable thermally insulating material or thermal barrier material. Such materials are known to those of skill in the art and as such, a detailed discussion herein is omitted for the sake of brevity. Suitable thermally insulating materials and/or thermal barrier materials include, but are not limited to, $HfO_2$—$Y_2O_3$ and ZComP™ 844 from Powdermet Inc. Photovoltaic cell 108 can be formed from various types of photovoltaic cells known to those of skill in the art. Such materials are known to those of skill in the art and as such, a detailed discussion herein is omitted for the sake of brevity. Active cooling heat exchanger 110 is formed from any suitable heat exchanger material. Suitable materials are known in the art. As such, a detailed discussion herein is omitted for the sake of brevity. Exemplary heat exchangers for use as the active cooling heat exchanger include, but are not limited to, microchannel heat exchangers, shell and tube heat exchangers, plate heat exchangers, regenerative heat exchangers, plate fin heat exchangers, and/or fluid heat exchangers. Active cooling heat exchanger 110 can be designed to be any suitable three-dimensional geometric shape and as such the present invention is not limited to any one shape and/or orientation. Reflective surface 112 is formed from any suitable reflective material. Such materials include, but are not limited to, metal reflective layers, polymer reflective layers, metalized polymer films, metalized glass and/or ceramic layers, or a combination of two or more thereof.

Figure 2:
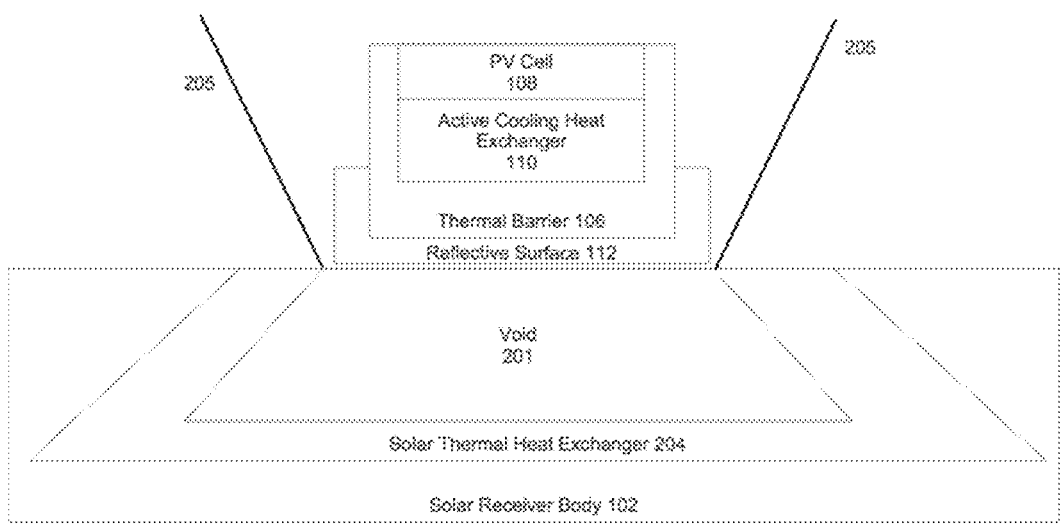
FIG. 2 is a cross-sectional illustration of another embodiment of a hybrid solar receiver in accordance with the present invention.

Turning to FIG. 2, FIG. 2 is a cross-sectional illustration of another embodiment of a hybrid solar receiver 200 in accordance with the present invention. Solar hybrid receiver 200 differs from hybrid solar receiver 100 of FIG. 1 in the placement and design of the solar thermal heat exchanger portion of device 200. In this embodiment, solar thermal heat exchanger 204 is formed in the manner shown in FIG. 2. The embodiment of FIG. 2 also includes a void 201 located between reflective surface 112 and solar thermal heat exchanger 204. Solar thermal heat exchanger 204 is formed from any suitable heat exchanger material. Suitable materials are known in the art. As such, a detailed discussion herein is omitted for the sake of brevity. Exemplary heat exchangers for use as the solar thermal heat exchanger include, but are not limited to, microchannel heat exchangers, shell and tube heat exchangers, plate heat exchangers, regenerative heat exchangers, plate fin heat exchangers, and/or fluid heat exchangers. Solar thermal heat exchanger 204 can be designed to be any suitable three-dimensional geometric shape and as such the present invention is not limited to any one shape and/or orientation. Hybrid solar receiver 200 further includes a solar receiver body 102 similar to that described in relation to the embodiment of FIG. 1. The solar receiver body 102 of FIG. 2 can be formed from any suitable material including, but not limited to, ceramic material, metal, plastic, or a combination of two or more thereof.

Figure 3:
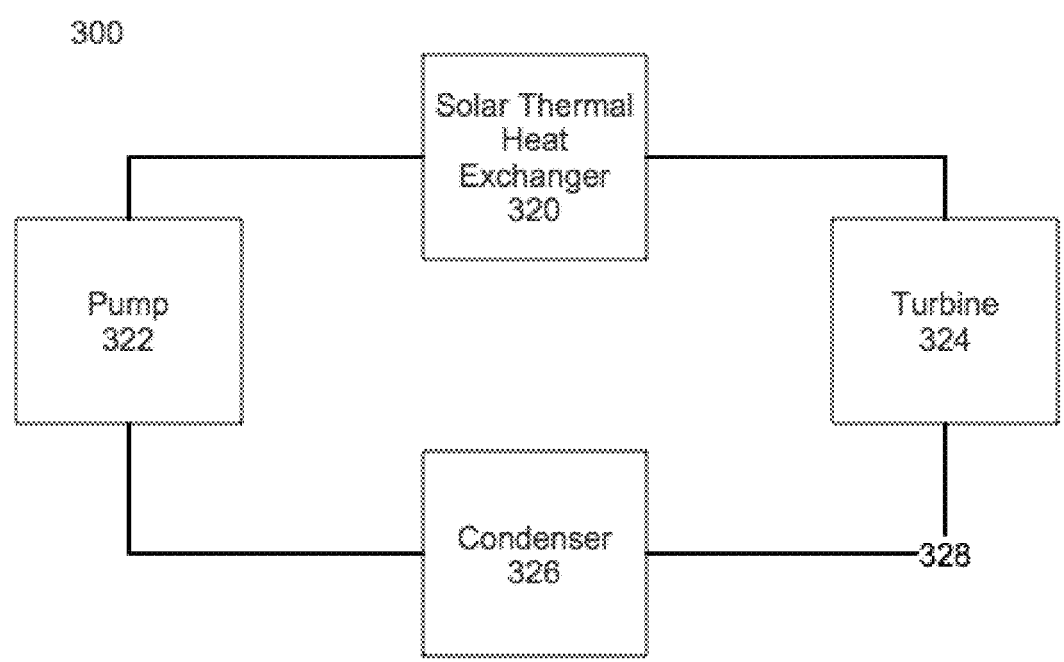
FIG. 3 is a schematic illustration of a power generation system that utilizes a hybrid solar receiver in accordance with one embodiment of the present invention.

Turning to FIG. 3, FIG. 3 is a schematic illustration of a power generation system 300 that utilizes a hybrid solar receiver in accordance with one embodiment of the present invention. In system 300 of FIG. 3 the solar heat exchanger portion 320 of a hybrid solar receiver is connected to a pump 322 and a turbine 324 that is able to generate power. Pump 322 and turbine 324 are also connected to a condenser 326. In this embodiment, a working fluid is used to convey and/or transfer thermal energy to turbine 324 via piping 328. Such fluids include, but are not limited to, typical organic refrigerant fluids (e.g., R134a, etc), typical inorganic fluids (e.g., water, ammonia, etc.) or even inert gases (e.g., carbon dioxide, nitrogen, air, etc) that are contained within the system under pressure so as to place them in a fluidic state, or supercritical state.

Figure 4:
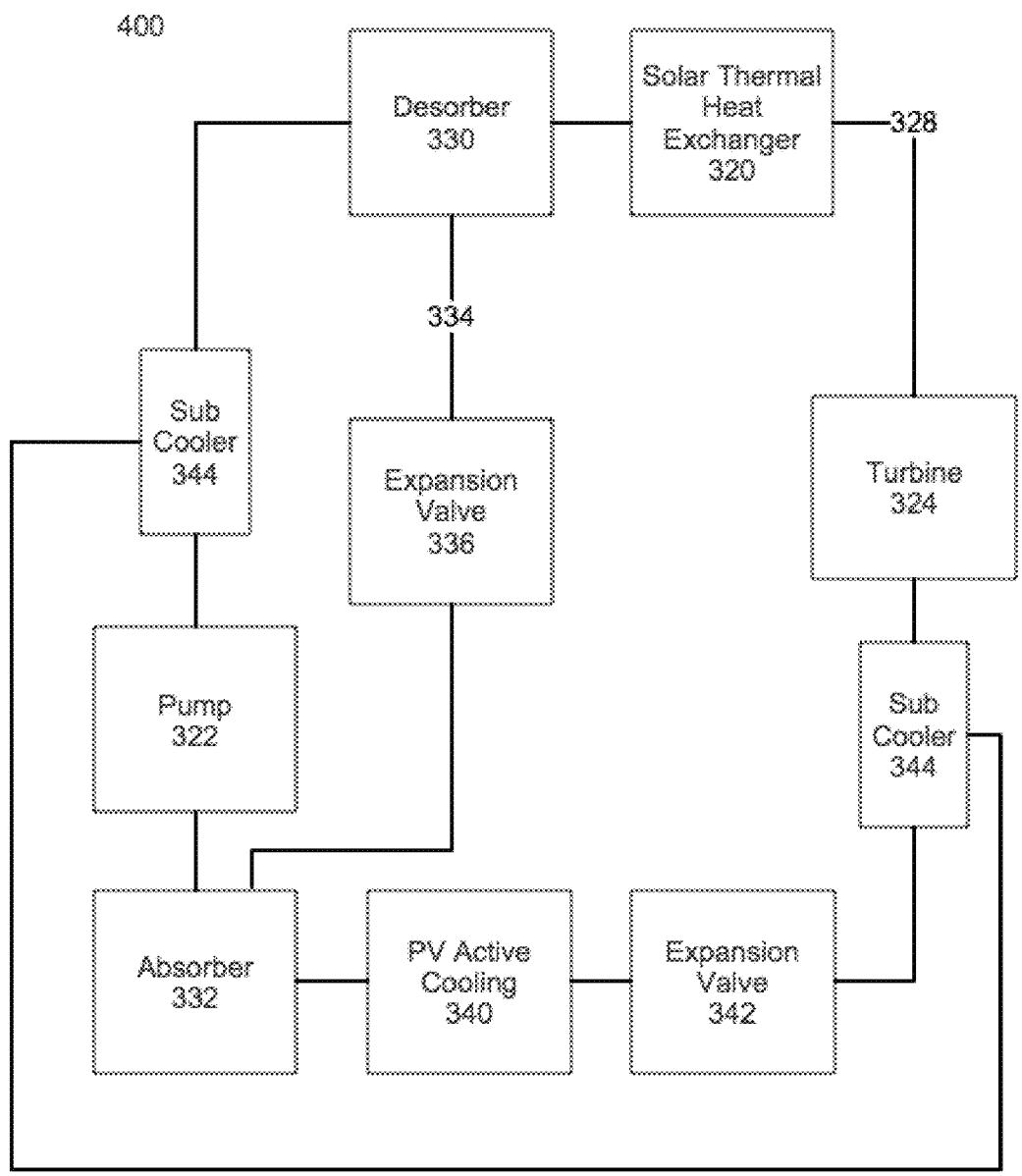
FIG. 4 is a schematic illustration of a power generation system that utilizes a hybrid solar receiver in accordance with another embodiment of the present invention.

FIG. 4 is a schematic illustration of power generation system 400 that utilizes a hybrid solar receiver in accordance with another embodiment of the present invention. In system 400 of FIG. 4 the solar heat exchanger portion 320 of a hybrid solar receiver is connected to a desorber 330 and a turbine 324 via suitable piping 328. System 400 differs from system 300 in that it further comprises a desorber 330 placed between the solar thermal heat exchanger 320 and pump 322. Additionally, desorber 330 is connected to an absorber 332 via piping 334 with a valve 336 for controlling and/or supplying, as desired, working fluid from desorber 330 to absorber 332. Absorber 332 is placed between pump 332 and a photovoltaic active cooling device 340 (which replaces the condenser 326 of system 300). Valve 342 is placed between photovoltaic active cooling device 340 and turbine 324 as is illustrated in FIG. 4 so as to control, as desired, the flow of working fluid there through. System 400 further comprises a sub-cooler 344 as illustrated in FIG. 4.

Figure 5:
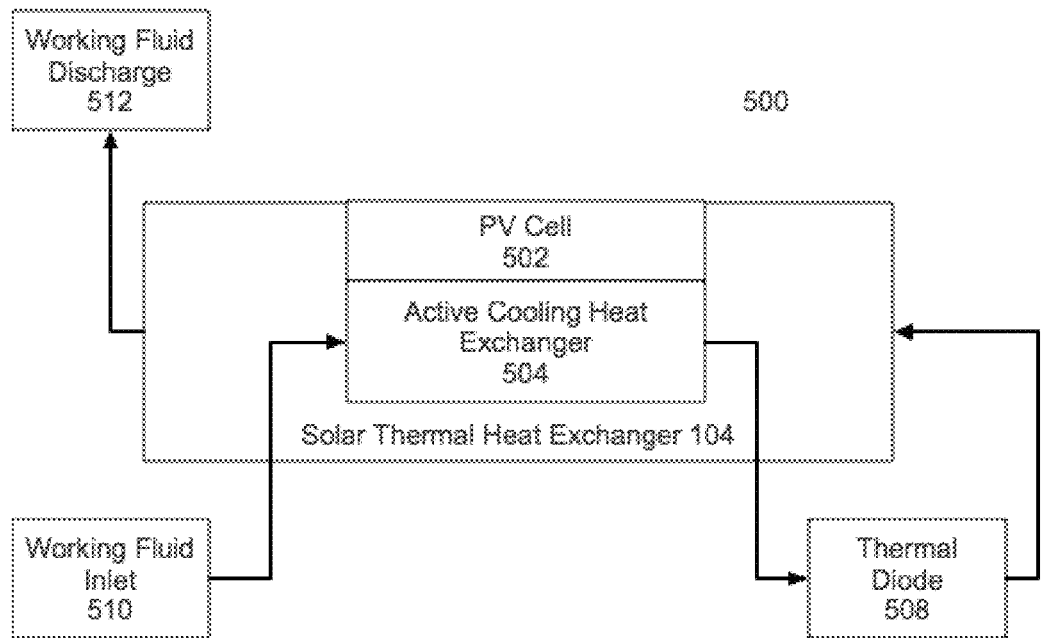
FIG. 5 is a cross-sectional illustration of one embodiment of a hybrid solar receiver in accordance with one embodiment of the present invention that utilizes a working fluid.

FIG. 5 is a cross-sectional illustration of one embodiment of a hybrid solar receiver 500 that utilizes a working fluid. Hybrid solar receiver 500 comprises a photovoltaic cell 502, an active cooling heat exchanger 504 and a solar thermal heat exchanger 506. Active cooling heat exchanger 504 and solar thermal heat 506 are connected to a thermal diode 508 that enables heat transported via, for example, a working fluid to flow in a desired direction (such as the direction illustrated FIG. 5). Given the above, active cooling heat exchanger 504 comprises a working fluid inlet 510 to supply device 500 with working fluid. Additionally, solar thermal heat exchanger 506 comprises a working fluid discharge 512 to permit the working fluid to be transported elsewhere in order to supply, for example, thermal energy to a device (e.g., to drive a turbine).

Figure 6:
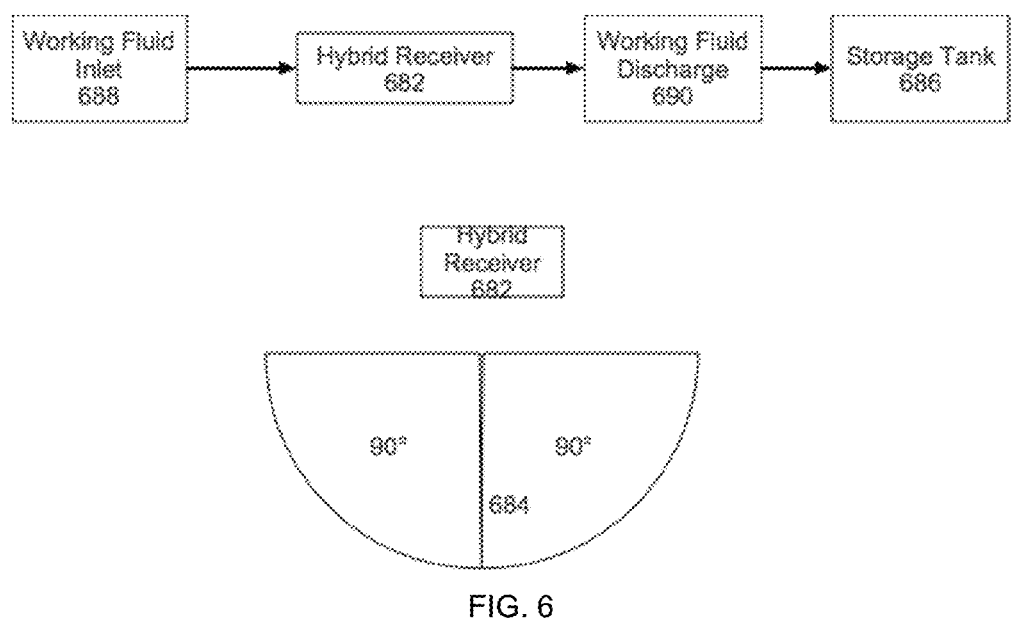
FIG. 6 is a cross-sectional illustration of a hybrid solar receiver in accordance with one embodiment of the present invention in combination with a concentrator.

FIG. 6 is a cross-sectional illustration of a hybrid solar receiver 682 in accordance with one embodiment of the present invention in combination with a concentrator 684. Also illustrated in FIG. 6 is one possible embodiment by which receiver 682 supplies thermal energy to a storage tank 686 via a working fluid supplied from inlet 688 through receiver 682 where it picks up solar energy from receiver 682 and transports it to storage tank 686 via outlet 690.

Figure 7:
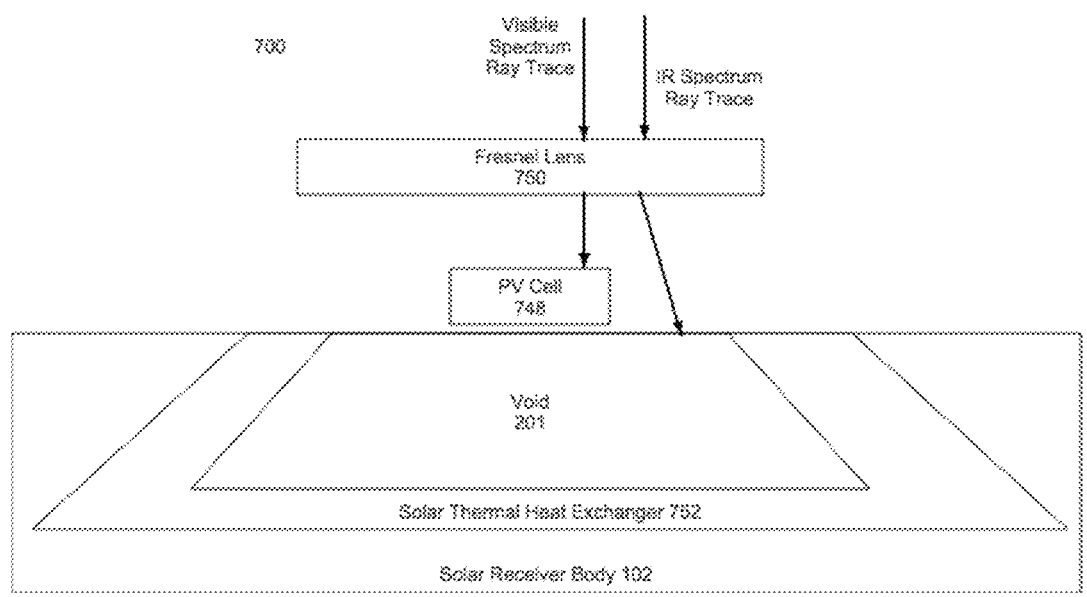
FIG. 7 is a cross-sectional illustration of a hybrid solar receiver in accordance with another embodiment of the present invention.

FIG. 7 is a cross-sectional illustration of a hybrid solar receiver 700 comprising at least one photovoltaic cell 748, at least one Fresnel lens 750 operable as a solar concentrator; and at least one heat exchanger 752 designed to capture thermal energy from the solar receiver.

Figure 8:
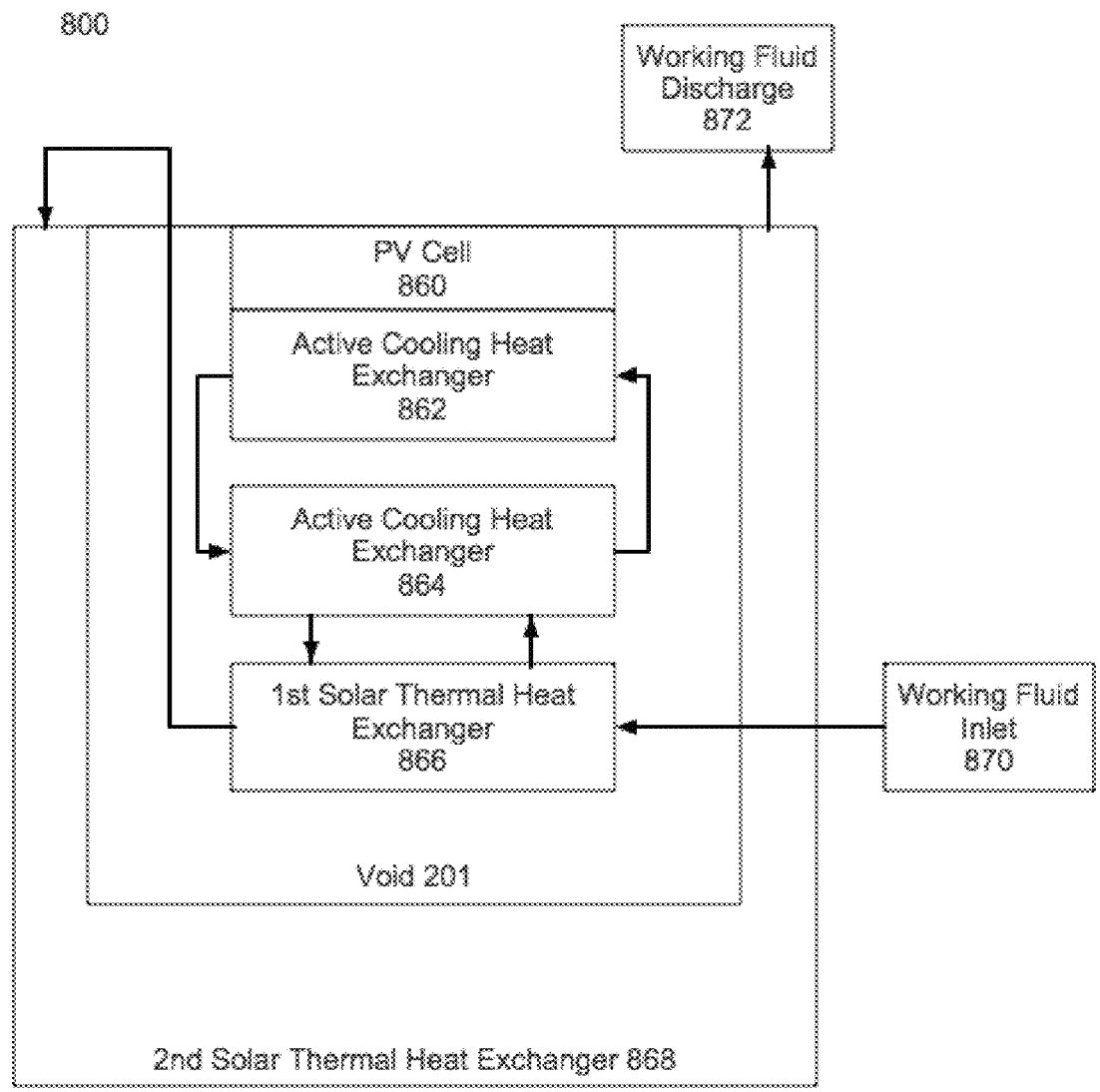
FIG. 8 is a cross-sectional illustration of a hybrid solar receiver in accordance with another embodiment of the present invention.

FIG. 8 is a cross-sectional illustration of a hybrid solar receiver 800 comprising at least one photovoltaic cell 860, at least one active cooling heat exchanger 862, at least one active cooling heat exchanger condenser 864, and at least two solar thermal heat exchangers 866 and 868. As can be seen from FIG. 8, receiver 800 contains various piping structures the permit the flow of working fluid through the various components of receiver 800. In this regard, solar thermal heat exchanger 866 comprises at least one working fluid inlet 870 for providing to receiver 800 a working fluid. Solar thermal heat exchanger 868 comprises at least one working fluid outlet 872 for providing working fluid and therefore in one embodiment thermal energy to a device (e.g., to drive a turbine).

Figure 9:
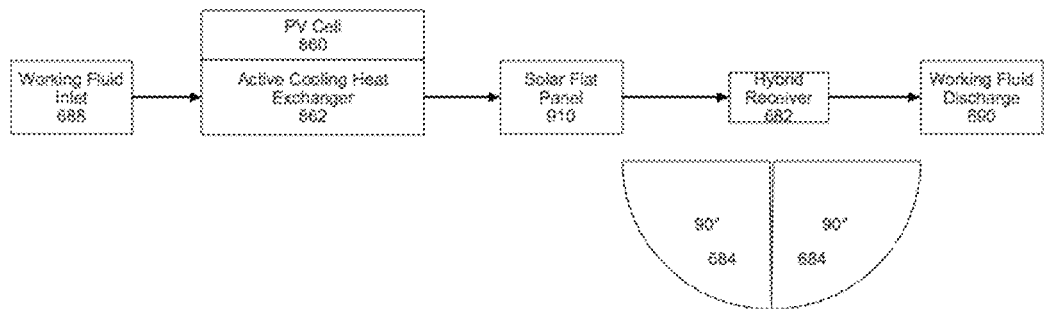
FIG. 9 is an illustration of a mixed field array in accordance with one embodiment of the present invention.
Figure 10:
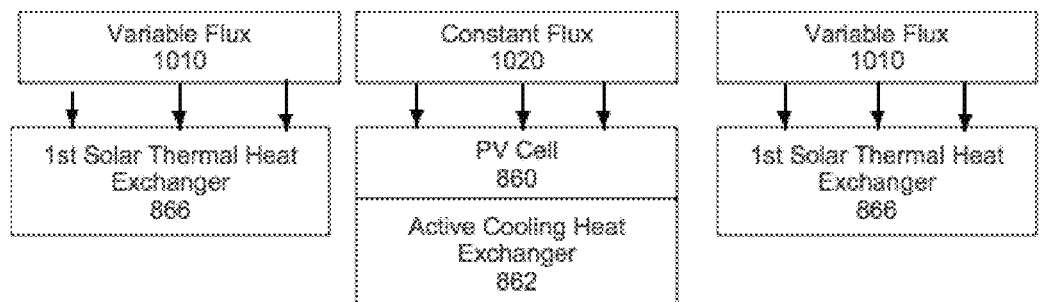
FIG. 10 illustrates a variable flux hybrid solar receiver in accordance with one embodiment of the present invention.

FIG. 9 is an illustration of a mixed field array in accordance with one embodiment of the present invention. In the mixed field array of FIG. 9, any suitable receiver in accordance with the present invention can be utilized. FIG. 10 illustrates a variable flux hybrid solar receiver in accordance with one embodiment of the present invention.

As can be seen from FIG. 10, this embodiment can contain at least two solar thermal heat exchangers and at least one photovoltaic cell designed to take advantage of, for example, areas of constant flux and variable flux. Referring to FIG. 10, the optical influx of solar light is focused onto a photovoltaic cell 860. The backside of photovoltaic cell 860 is cooled using active cooling heat exchanger 862 to maintain photovoltaic cell 860 at a temperature less than the critical junction temperature. The conversion efficiency/performance of a photovoltaic cell 860 is dependent on a constant flux across the entire surface of photovoltaic cell 860. The term constant flux means a variation from maximum to minimum of less than about 5%, and the average variation from the minimum to maximum of less than about 7%. Optical influx realized by concentrating solar light unfortunately achieves variable flux 1010 (i.e., variation greater than about 7%). Importantly, variable flux 1010 does not change the conversion efficiency when energy is absorbed by the first solar thermal heat exchanger 866 therefore enabling the higher conversion efficiency of the hybrid solution and being more forgiving of the tracking error.

Figure 11:
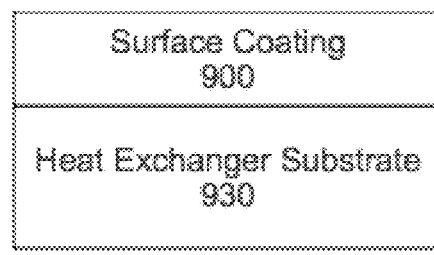
FIG. 11 illustrates a surface coated heat exchanger that can be used in conjunction with various embodiments of the present invention.

Also within the scope of the present invention is a coated heat exchanger as represented in one embodiment by FIG. 11. As can be seen in FIG. 11, a suitable heat exchanger 930 is coated with a surface coating 900. In one embodiment, heat exchanger substrate is formed from stainless steel while surface coating 900 is formed from a tandem absorber of TiAlN/TiAlON/Si$_3$N$_4$.

Figure 12:
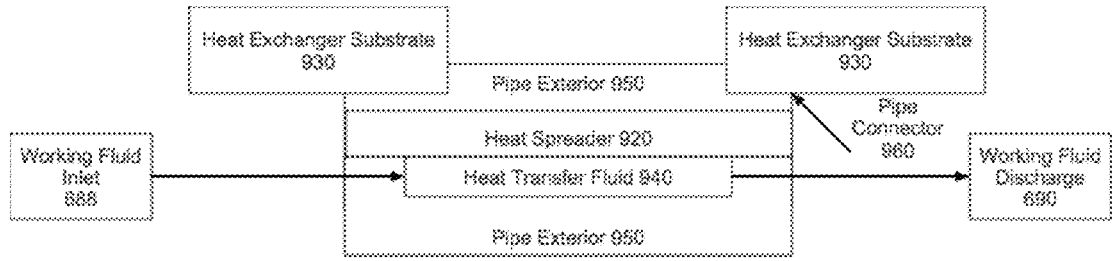
FIG. 12 illustrates a heat spreader design that can be used in conjunction with various embodiments of the present invention.

Turning to FIG. 12, FIG. 12 illustrates a heat spreader that is integral to the fluid piping in thermal continuity with at least one of the heat exchanger substrate within the hybrid solar receiver. The fluid piping connects the multiple hybrid solar receivers within an array of hybrid solar receivers. This embodiment contains at least two hybrid solar receivers, the heat transfer fluid used to remove thermal energy from the hybrid solar receiver additionally removes heat through the heat spreader that is integral to hybrid solar receiver by leveraging the large surface area in the fluid pipe between the array of individual hybrid solar receivers. The heat transfer fluid is contained by the fluid pipe exterior 950 and then further insulated, which for clarity is not shown. The fluid pipe is connected to the heat exchanger with a pipe connector.

Specifically, the heat spreader of FIG. 12 comprises a working fluid inlet 688, a working fluid discharge and/or outlet 690, a heat spreader 920, a heat exchanger substrate 930, a heat transfer fluid 940, a pipe 950 (represented by pipe exterior 950) and a pipe connector 960 that connects the pipe to heat exchanger substrate 930.

Figure 13:
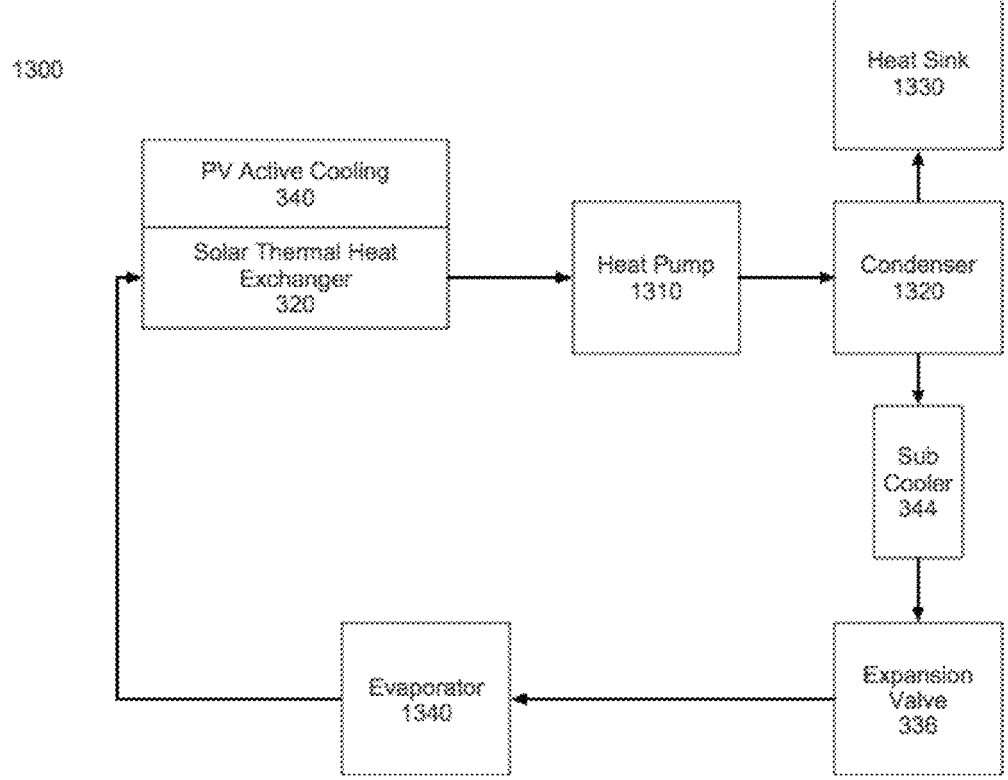
FIG. 13 illustrates a photovoltaic and thermal system according to one embodiment of the present invention.

Turning to FIG. 13, FIG. 13 illustrates a hybrid photovoltaic and thermal solution that comprises a heat pump 1310 to lift (i.e., elevate the working fluid from the incoming temperature to a higher discharge temperature) the working fluid temperature to provide thermal energy through condenser 1320 to a heat sink 1330. Heat sink 1330 harvests thermal energy into a range of applications including domestic hot water, heating, or industrial process (e.g., dryers). Additional thermal energy is removed from the working fluid through an optional sub cooler 344, particularly when air conditioning or refrigeration is desired. The air conditioning resulting from the expanded working fluid can be provided in part to a heat source via the evaporator 1340 with subsequent air conditioning providing active cooling 340 to the photovoltaic with the working fluid being at least 1 degrees Celsius lower than the ambient temperature of the hybrid solar receiver. Operating in this mode is desirable when the thermal energy resulting by providing active cooling to the photovoltaic cell is not of sufficiently high quality to be useful to a heat sink 1330. The heat pump has a high coefficient of performance resulting in a very efficient method of providing thermal energy to the heat sink 1330 especially when the harvested thermal energy serves the role of improving the photovoltaic cell efficiency. The working fluid is then in fluid communication with an expansion valve 336 causing the working fluid to cool as it expands from the high side pressure to the low side pressure. The working fluid is then in fluid communication with evaporator 1340 prior to closing the thermodynamic loop by entering solar thermal heat exchanger 320. Solar thermal heat exchanger 320 enables thermal energy to be removed from the photovoltaic through active cooling 340.

In one instance, a method of operation is the working fluid downstream of the photovoltaic cell 340 is more than 2 degrees Celsius lower than the photovoltaic cell 340 maximum junction temperature, the working fluid inlet temperature to the heat pump 1310 is at least 5 degrees Celsius (this is the temperature lift) lower than the discharge temperature of the heat pump 1310. In this instance, the heat sink 1330 downstream of the heat pump 1310 lowers the temperature of the working fluid to at least 30% of the temperature lift. The sub cooler 344 removes the balance of the thermal energy to approach the ambient temperature of the hybrid solar receiver, which enables the heat pump to concurrently provide air conditioning.

In one instance, a method of operation is the selection of the low side operating pressure such that phase change from a liquid to a vapor occurs within −2° C. from the maximum junction temperature of photovoltaic cell 340. Selection of the operating pressure minimizes the working fluid and thus the peak temperature of photovoltaic cell 340, which increases the photon to electron energy conversion. The method of operation is the selection of the high side operating pressure such that discharge temperature from the heat pump is within +2° C. of the desired heat sink 1330 process temperature. The utilization of the heat pump 1310 to create temperature lift enables the photovoltaic cell 340 to operate at a lower temperature and concurrently producing useful thermal energy.

In another instance, a method of operation is the selection of a working fluid, such as R245fa at a low side pressure of about 35 psi. The working fluid inlet temperature is about 35° C. prior to entering solar thermal heat exchanger 320. The mass flow rate is selected to match the thermal flux from the waste heat of photovoltaic cell 340. The enthalpy increases from 246.40 kJ/kg (state point of 35° C. and 35 psi) to 435.24 kJ/kg. The working fluid is then subsequently superheated by, in one instance, the infrared portion of the spectrum (which represents approximately 47% of the solar spectrum) to 200° C. at an enthalpy of 603.26 kJ/kg.

In another embodiment, the present invention relates to a hybrid solar receiver comprising: at least one photovoltaic cell; at least one heat exchanger; and at least one heat pump, wherein the at least one heat exchanger provides active cooling to the at least one photovoltaic cell and the at least one heat pump lifts a working fluid temperature from a heat pump incoming temperature to a heat pump discharge temperature, wherein the heat pump incoming temperature is at least about 5° C. less than the heat pump discharge temperature, and wherein the heat pump inlet temperature is at least about 2° C. lower than the photovoltaic cell maximum junction temperature.

In another embodiment, the heat pump incoming temperature is at least about 7.5° C. less than the heat pump discharge temperature, at least about 10° C. less than the heat pump discharge temperature, at least about 12.5° C. less than the heat pump discharge temperature, or even at least about 25° C. less than the heat pump discharge temperature. In another embodiment, the heat pump inlet temperature is at least about 3° C. lower than the photovoltaic cell maximum junction temperature, at least about 5° C. lower than the photovoltaic cell maximum junction temperature, at least about 7.5° C. lower than the photovoltaic cell maximum junction temperature, or even at least about 10° C. lower than the photovoltaic cell maximum junction temperature. Here, as well as elsewhere in the specification and claims, individual numerical values and/or individual range limits can be combined to form non-disclosed ranges.

In another embodiment, the above hybrid solar receiver further comprises: at least one condenser; at least one heat sink; and at least one sub-cooler, wherein the at least one condenser is downstream of the at least one heat pump and the at least one sub-cooler is downstream of the at least one condenser, and wherein the condenser transfers thermal energy to the heat sink. In still another embodiment, the above hybrid solar receiver further comprising: at least one expansion valve; and at least one evaporator, wherein the sub-cooler is downstream of the at least one expansion valve and the at least one evaporator is downstream of the at least one photovoltaic cell, and wherein the working fluid provides active cooling to the at least one photovoltaic cell at an incoming temperature at least about 1° C. cooler than ambient temperature operable to increase energy conversion efficiency of the at least one photovoltaic cell.

In another embodiment, the working fluid provides active cooling to the at least one photovoltaic cell at an incoming temperature at least about 2° C. cooler than ambient temperature operable to increase energy conversion efficiency of the at least one photovoltaic cell, at least about 3° C. cooler than ambient temperature operable to increase energy conversion efficiency of the at least one photovoltaic cell, at least about 5° C. cooler than ambient temperature operable to increase energy conversion efficiency of the at least one photovoltaic cell, or even at least about 7.5° C. cooler than ambient temperature operable to increase energy conversion efficiency of the at least one photovoltaic cell. Here, as well as elsewhere in the specification and claims, individual numerical values and/ or individual range limits can be combined to form non-disclosed ranges.

Although the invention has been described in detail with particular reference to certain embodiments detailed herein, other embodiments can achieve the same results. Variations and modifications of the present invention will be obvious to those skilled in the art and the present invention is intended to cover in the appended claims all such modifications and equivalents.

What is claimed is:

1. A hybrid solar receiver comprising:
   at least one photovoltaic cell;
   at least two heat exchangers,
   wherein at least one of the heat exchangers from the at least two heat two exchangers provides active cooling of the photovoltaic cell; wherein at least one of the another heat exchanger from the at least two heat two exchangers provides thermal energy to drive at least one thermodynamic cycle; wherein the hybrid solar receiver further comprises at least two thermally isolated zones; and wherein the first thermally isolated zone is for the at least one photovoltaic cell and the second thermally isolated zone is for the at least one thermodynamic cycle.

2. The hybrid solar receiver of claim 1, wherein the temperature differential between the first thermally isolated zone and the second thermally isolated zone is at least about 50° C.

3. The hybrid solar receiver of claim 1, wherein the temperature differential between the first thermally isolated zone and the second thermally isolated zone is in the range of about 100° C. to about 500° C.

4. The hybrid solar receiver of claim 1, wherein the hybrid solar receiver is paired with a solar concentrator that has an incidence solar flux yielding an irradiance on the hybrid solar receiver, wherein the direct irradiance on the hybrid solar receiver is on both the at least one photovoltaic cell and the second thermally isolated zone.

5. The hybrid solar receiver of claim 1, wherein the hybrid solar receiver is non-isothermal.

6. The hybrid solar receiver of claim 4, wherein the hybrid solar receiver further comprises at least one reflective surface wherein the at least one reflective surface reflects at least about 80% of the reflected light away from the back surface of the at least one photovoltaic cell.

7. The hybrid solar receiver of claim 6, wherein the at least one reflective surface reflecting light away from the back surface of the at least one photovoltaic cell has an emissivity greater than about 50%.

8. The hybrid solar receiver of claim 6, wherein the at least one reflective surface reflecting light away from the back surface of the at least one photovoltaic cell has an emissivity up to about 95%.

9. The hybrid solar receiver of claim 4, wherein the second thermally isolated zone has a non-linear cavity.

10. The hybrid solar receiver of claim 1
    wherein the hybrid solar receiver is operable in at least two operating modes including a radiant collecting mode and radiant reflecting mode.

11. The hybrid solar receiver of claim 10, wherein the radiant collecting mode is operational at times of direct incidence solar flux, and the radiant reflecting mode is operational at times when no direct incidence solar flux is available operable to provide radiant cooling to the working fluid.

12. The hybrid solar receiver of claim 11, wherein the radiant cooling provides cooling to the working fluid to a temperature below an ambient temperature.

13. The hybrid solar receiver of claim 1, further comprising at least one heat pump with at least one heat pump heat exchanger and a heat pump working fluid:
    wherein the at least one heat exchanger providing active cooling of the photovoltaic cell is in thermal communication with the at least one heat pump heat exchanger operable with the at least one heat pump to lift the heat pump working fluid temperature from a heat pump incoming temperature to a higher heat pump discharge temperature.

* * * * *